(12) United States Patent
Hoekstra

(10) Patent No.: US 7,291,939 B2
(45) Date of Patent: Nov. 6, 2007

(54) TWO WIRE TOUCH SENSOR INTERFACE

(75) Inventor: Eric J. Hoekstra, Holland, MI (US)

(73) Assignee: TouchSensor Technologies, LLC, Wheaton, IL (US)

( * ) Notice: Subject to any disclaimer, the term of this patent is extended or adjusted under 35 U.S.C. 154(b) by 154 days.

(21) Appl. No.: 10/844,934

(22) Filed: May 13, 2004

(65) Prior Publication Data

US 2005/0168909 A1 Aug. 4, 2005

Related U.S. Application Data

(60) Provisional application No. 60/470,961, filed on May 15, 2003.

(51) Int. Cl.
*H01H 3/26* (2006.01)

(52) U.S. Cl. .................................................... 307/140

(58) Field of Classification Search ................. 307/134, 307/140
See application file for complete search history.

(56) References Cited

U.S. PATENT DOCUMENTS

| 3,805,096 | A | * | 4/1974 | Hamilton, II | ................ | 307/116 |
| 5,309,084 | A | * | 5/1994 | Jiang | .......................... | 323/321 |
| 5,327,070 | A | * | 7/1994 | Seki et al. | .................. | 323/222 |
| 5,412,255 | A |   | 5/1995 | Wallrafen |   |   |
| 2002/0047595 | A1 | * | 4/2002 | Bruwer | ................... | 315/200 A |

FOREIGN PATENT DOCUMENTS

DE 3511207 A1 10/1986

* cited by examiner

*Primary Examiner*—Robert L. Deberadinis
(74) *Attorney, Agent, or Firm*—Jenner & Block

(57) ABSTRACT

A touch sensor interfaces with a control system or controlled device using two wires. The output of the touch sensor controls an output switch.

5 Claims, 2 Drawing Sheets

"OFF" TIME IS ~ 54uS,
"ON" TIME IS ~ 6.1 mS.
DUTY CYCLE (ON PERCENT) ~ 99.1%

TWO WIRE TOUCH SENSOR INTERFACE

CROSS REFERENCE TO RELATED APPLICATIONS

This application claims priority from U.S. Provisional Patent Application Ser. No. 60/470,961, filed on May 15, 2003, the disclosure of which is incorporated herein by reference.

BACKGROUND OF THE INVENTION

1. The Technical Field

The present invention is directed to methods and apparatus for interconnecting a field effect sensor with a control system or controlled device using only two wires.

2. The Related Art

Touch sensors are often desirable as replacements for mechanical switches. However, certain limitations apply when replacing a mechanical switch with a touch sensor. For example, whereas a typical mechanical switch is a simple two terminal device, a conventional touch sensor typically requires three wires for operation, namely, a power input wire, a ground wire, and an output wire. Thus, replacement of a mechanical switch with a touch sensor often requires addition of a third wire that is not required for use with the mechanical switch. This adds cost and complexity and can render the use of a touch sensor as a replacement for a mechanical switch prohibitive in certain applications.

DETAILED DESCRIPTION OF THE ILLUSTRATED EMBODIMENT

Figure 1:
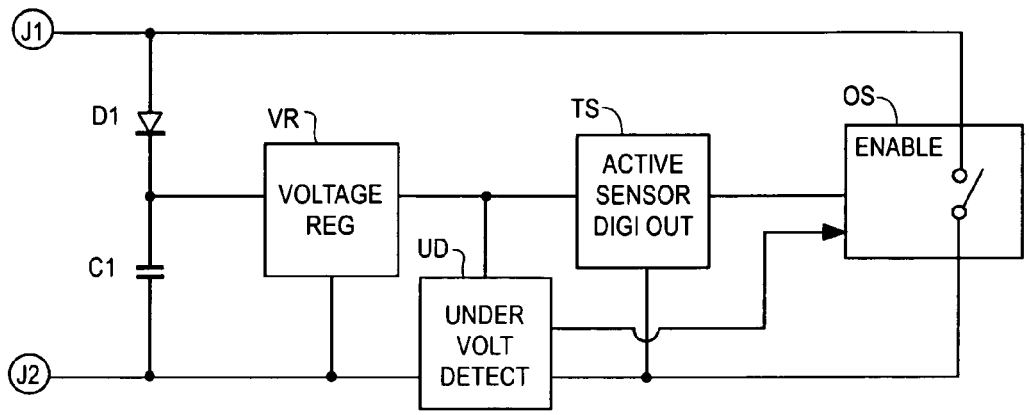
FIG. 1 is a block diagram illustrating the concepts of the present invention.

FIG. 1 is a block diagram representing conceptually a device 10 according to a preferred embodiment of the present invention. Terminals J1,J2 are coupled to a source of operating voltage (not shown), for example, the wires leading to and from a mechanical switch that is to be replaced with a sensor apparatus according to the present invention. The first and second terminals of switching diode D1 are coupled to terminal J1 and the first terminal of capacitor C1. The second terminal of storage capacitor C1 is coupled to terminal J2. The junction of switching diode D1 and storage capacitor C1 is coupled to the input of voltage regulator VR. The output of voltage regulator VR is coupled to the inputs of touch sensor TS and undervoltage detector UD. The outputs of touch sensor TS and undervoltage detector UD are coupled to inputs of output switch OS, the power terminals of which are coupled to terminals J1,J2, respectively. The grounds of each of voltage regulator VR, undervoltage detector UD, and touch sensor TS are coupled to terminal J2.

In operation, the voltage across terminals J1,J2 charges storage capacitor C1 through switching diode D1. The voltage across terminals J1,J2 also biases voltage regulator VR through switching diode D1. So long as the output from voltage regulator VR to the input of touch sensor TS is greater than a predetermined voltage, undervoltage detector UD allows touch sensor TS to control output switch OS. In this condition and with touch sensor TS not actuated, output switch OS is "off," or non-conductive, emulating an open mechanical switch. In this condition and with touch sensor TS actuated, output switch OS is "on," or conductive, emulating a closed mechanical switch. However, if the output from voltage regulator VR to the input of touch sensor TS is lower than a predetermined voltage, undervoltage detector UD disables output switch OS. In this condition, output switch OS remains off, regardless of the state of touch sensor TS.

When output switch OS is off, the voltage across terminals J1,J2 is applied to storage capacitor C1, as described above. When output switch OS is on, it essentially short circuits terminals J1,J2, reverse biasing switching diode D1 and removing any charging voltage from storage capacitor C1. In this condition, storage capacitor C1 discharges through voltage regulator VR and touch sensor TS. Eventually, storage capacitor C1 discharges to a level where the input voltage to voltage regulator VR is insufficient to maintain a voltage regulator VR output voltage (and touch sensor TS input voltage) greater than the predetermined voltage discussed above. When the output voltage from voltage regulator VR falls below the predetermined voltage, undervoltage detector UD disables output switch OS, causing output switch OS to open, or return to the "off" state. With output switch OS open, or "off," voltage is again applied to storage capacitor C1 through switching diode D1, charging storage capacitor C1 and biasing voltage regulator VR. In a typical physical embodiment, the foregoing cycle repeats such that output switch OS is closed or "on" about 95% or more of the time that touch sensor TS is continuously activated and open or "off" 100% of the time that touch sensor TS not activated.

Figure 2:
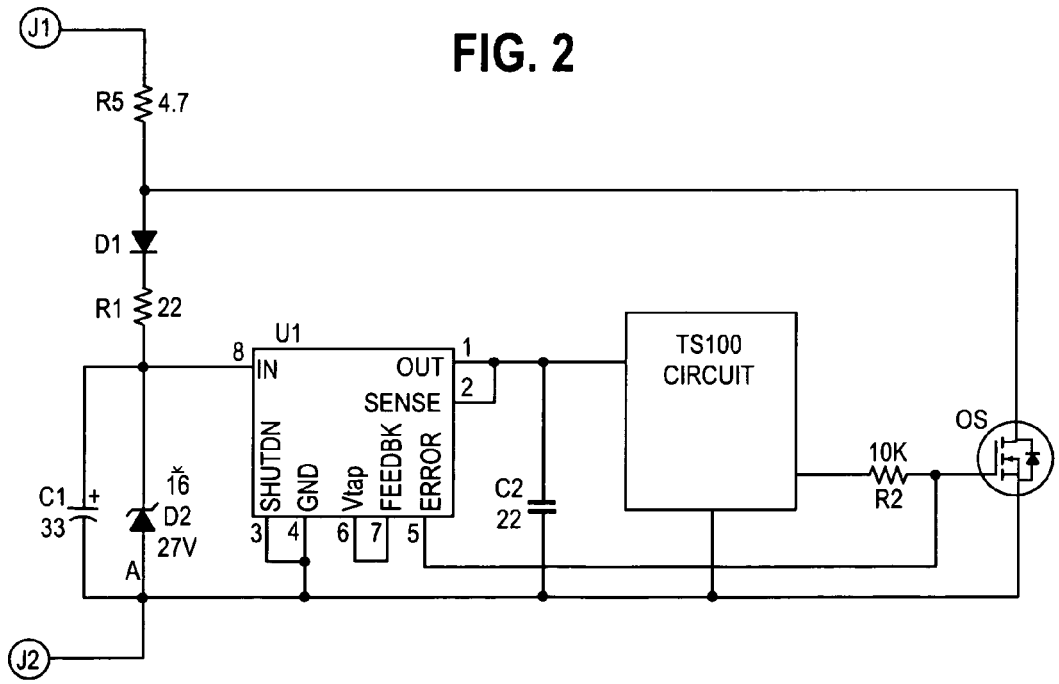
FIG. 2 is a schematic diagram illustrating an apparatus according to a preferred embodiment of the present invention.

FIG. 2 illustrates schematically a device 20 constructed using commercially available components according to a preferred embodiment of the present invention. Device 20 is similar to device 10 described above in connection with FIG. 1, but incorporates the functions of voltage regulator VR and undervoltage detector UD of the FIG. 1 embodiment in a single device, namely, voltage regulator U1. Voltage regulator U1 preferably is embodied as an LP2951 voltage regulator available from National Semiconductor, among others. The "error" pin of this device is coupled to the control input of output switch OS. When the output voltage of voltage regulator U1 (and, thus, the input voltage to touch sensor TS) is lower than a predetermined voltage, the "error" pin of voltage regulator U1, and, therefore, the control input to output switch OS, is tied internally to ground. When the output voltage of voltage regulator U1 (and, thus, the input voltage to touch sensor TS) is greater than the predetermined voltage, the "error" pin of voltage regulator U1 is essentially tied internally to an open circuit.

Device 20 also includes the following additional circuit elements not shown in the FIG. 1 embodiment: first peak current limiting resistor R5 coupled between terminal J1 and switching diode D1; second peak current limiting resistor R1 coupled between switching diode D1 and storage capacitor C1; zener diode D2 coupled in parallel with storage capacitor C1; current limiting resistor R2 coupled between the output of touch sensor TS and the control input to output switch OS; and second capacitor C2 coupled between the input to touch sensor TS and terminal J2. First and second peak current limiting resistors R1 and R5 can be omitted, but are desirable in automotive applications to mitigate EMC concerns and may be desirable in other applications, as well. Zener diode D2 protects voltage regulator VR from high voltage transients that might occur in, for example, systems having inductive loads. That is, if the input to zener diode D2 (and, therefore, the input voltage to voltage regulator VR) exceeds a predetermined value, then zener diode D2 will clamp the input voltage at the predetermined voltage. Zener diode D2 can be omitted from a particular application if transient protection is not of concern. Second capacitor C2 is provided to stabilize voltage regulator U1.

In preferred embodiments, touch sensor TS is embodied as a touch sensor using the TS100 control circuit, available from TouchSensor Technologies, LLC of Wheaton, Ill. Such a device is described in U.S. Pat. No. 6,320,282, the disclosure of which is incorporated herein by reference. Preferably, output switch OS is a field effect transistor (FET), although output switch OS can be embodied in other ways, as would be known to one skilled in the art.

The FIG. 2 embodiment is functionally similar to the FIG. 1 embodiment. That is, the voltage across terminals J1,J2 charges storage capacitor C1 through switching diode D1 and first and second peak current limiting resistors R5,R1. The voltage across terminals J1,J2 also biases voltage regulator U1 through switching diode D1 and first and second peak current limiting resistors R5,R1. So long as the output from voltage regulator U1 to the input of touch sensor TS is greater than a predetermined voltage, the "error" pin of voltage regulator U1 is tied internally to what is essentially an open circuit, as described above. In this condition, voltage regulator U1 allows touch sensor TS to control output switch OS. That is, with touch sensor TS not actuated, output switch OS is "off," emulating an open mechanical switch, and with touch sensor TS actuated, output switch OS is "on," emulating a closed mechanical switch. However, if the output from voltage regulator U1 to the input of touch sensor TS falls below the predetermined voltage, voltage regulator U1 disables output switch OS by tying the control input of output switch OS to ground, as described above. In this condition, output switch OS remains off, regardless of the state of touch sensor TS.

Figure 3:
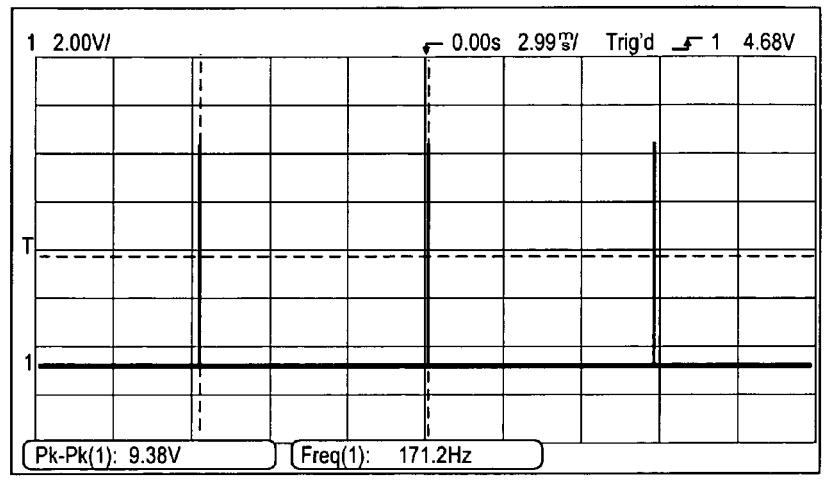
FIG. 3 is a graph showing voltage output as a function of time of an output switch according to a preferred embodiment the present invention.

When output switch OS is off, the voltage across terminals J1,J2 is applied to storage capacitor C1, as described above in connection with FIG. 1. When output switch OS is on, it essentially short circuits terminals J1,J2, reverse biasing switching diode D1 and removing any charging voltage from storage capacitor C1. In this condition, storage capacitor C1 discharges through voltage regulator U1 and touch sensor TS. Eventually, storage capacitor C1 discharges to a level where the input voltage to voltage regulator U1 is insufficient to maintain a voltage regulator U1 output voltage (and touch sensor TS input voltage) greater than the predetermined voltage discussed above. When the output voltage from voltage regulator U1 falls below the predetermined voltage, voltage regulator U1 disables output switch OS (by grounding its control input through voltage regulator U1, as described above), causing output switch OS to open, or return to the "off" state. With output switch OS disabled, voltage is again applied to storage capacitor C1 through switching diode D1, charging storage capacitor C1 and biasing voltage regulator U1. In a prototype embodiment, the foregoing cycle repeats such that output switch OS is closed or "on" about 99.1% or more of the time that touch sensor TS is continuously activated and open or "off" 100% of the time that touch sensor TS not activated. This is illustrated in FIG. 3, which is a plot of voltage across output switch OS as a function of time with touch sensor TS continuously stimulated.

Figure 4:
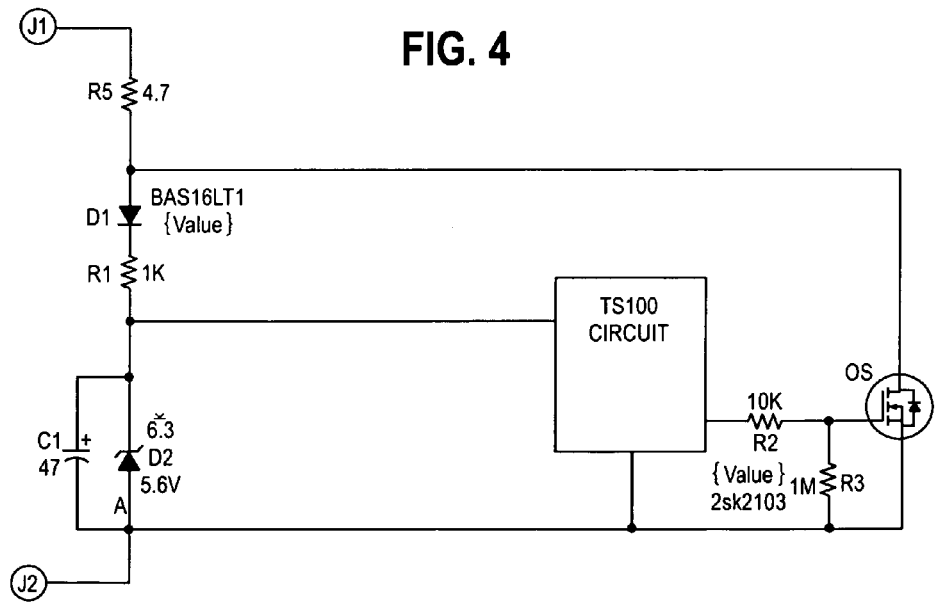
FIG. 4 is a schematic diagram illustrating an apparatus according to another preferred embodiment of the present invention.

FIG. 4 illustrates an alternate embodiment of the present invention. The FIG. 4 embodiment is similar to the FIG. 2 embodiment, except that it omits voltage regulator U1 and capacitor C2. Here, zener diode D2 is selected to provide both transient protection and voltage regulation. This embodiment also adds pull-down resistor R3 coupled between the control input of output switch OS and current limiting resistor R2. Pull-down resistor R3 is optional, depending on the characteristics of touch sensor TS. More particularly, if touch sensor TS has only an active high output, as would be known to one skilled in the art, then pull-down resistor R3 serves to generate a control voltage at the control input to output switch OS. If touch sensor TS has both active high and active low outputs, then pull-down resistor R3 may be omitted and replaced with an open circuit. Further, current limiting resistor R2 could be omitted.

In operation, the voltage between terminals J1 and J2 is applied to storage capacitor C1 and the input to touch sensor TS through first and second peak current limiting resistors R5,R1 and switching diode D1. When touch switch TS is stimulated, its output goes high, creating a potential at the junction of pull-down resistor R3 and the control input to output switch OS, which, in turn, biases output switch OS to the "on" state. With output switch OS on, terminal J1 essentially short circuits to terminal J2 through output switch OS, reverse biasing switching diode D1 and removing any charging voltage from storage capacitor C1. In this condition, storage capacitor C1 discharges through touch sensor TS. As it discharges, storage capacitor C1 continues to power touch sensor TS until the voltage across storage capacitor C1 is insufficient to drive touch sensor TS. At this point, whether stimulated or not, touch switch TS no longer generates an output to the control terminal of output switch OS, and output switch OS opens. With output switch OS open, the voltage across terminals J1 and J2 again is applied to storage capacitor C1 and the foregoing cycle repeats. Although the FIG. 4 embodiment does not offer as great a level of precision and control as the FIG. 2 embodiment, it may be sufficiently precise to perform adequately in many applications, at lower cost than the FIG. 2 embodiment.

The voltage, resistance, and capacitance values stated in the drawings are representative, preferred values. Other values of voltage, resistance, and capacitance may be used, as well, as would be readily determined by one skilled in the art.

While several embodiments of the present invention have been shown and described above, it will be obvious to those skilled in the art that numerous modifications can be made without departing from the spirit of the invention, the scope of which is defined by the claims below.

I claim:

1. A touch controlled switch apparatus having a two wire interface, comprising:

a high voltage terminal coupled to a source of high voltage;

a low voltage terminal coupled to a source of low voltage;

an output switch having a first terminal coupled to said high voltage terminal and a second terminal coupled to said low voltage terminal;

a first diode having a first terminal coupled to said high voltage terminal;

a first capacitor having a first terminal coupled to said low voltage terminal and a second terminal coupled to a second terminal of said first diode;

a touch sensor comprising at least one sensing electrode and a control circuit coupled to said at least one sensing electrode, said control circuit having an input coupled to the junction of said first diode and said first capacitor, said control circuit further having a control output coupled to a control input terminal of said output switch;

a voltage regulator having a power input coupled to said second terminal of said first diode and said second terminal of said first capacitor and a power outout coupled to said control circuit; and an enablement circuit adapted to selectively enable and disable said output switch according to a predetermined criterion.

2. The apparatus of claim 1 further comprising a zener diode coupled between said first diode and said low voltage terminal.

3. The apparatus of claim 2 wherein said zener diode is coupled in parallel with said first capaeitor.

4. The apparatus of claim 1 wherein said output switch is disabled when said output of said voltage regulator falls below a predetermined voltage.

5. The apparatus of claim 1 wherein said output switch is open when said output of said voltage regulator falls below a predetermined voltage.

* * * * *